United States Patent
Torok et al.

(10) Patent No.: US 6,738,284 B2
(45) Date of Patent: May 18, 2004

(54) TRANSPINNOR-BASED SAMPLE-AND-HOLD CIRCUIT AND APPLICATIONS

(75) Inventors: E. James Torok, Shoreview, MN (US); Richard Spitzer, Berkeley, CA (US); Shayne M. Zurn, Champlin, MN (US)

(73) Assignee: Integrated Magnetoelectronics Corporation, Berkeley, CA (US)

( * ) Notice: Subject to any disclaimer, the term of this patent is extended or adjusted under 35 U.S.C. 154(b) by 78 days.

(21) Appl. No.: 10/107,525

(22) Filed: Mar. 25, 2002

(65) Prior Publication Data

US 2002/0180431 A1 Dec. 5, 2002

Related U.S. Application Data

(60) Provisional application No. 60/278,323, filed on Mar. 23, 2001.

(51) Int. Cl.$^7$ .............................................. G11C 11/00
(52) U.S. Cl. ........................................ 365/158; 324/252
(58) Field of Search ................................ 365/158, 171, 365/173; 257/421; 324/252

(56) References Cited

U.S. PATENT DOCUMENTS

| | | | |
|---|---|---|---|
| 3,972,786 A | 8/1976 | Ballard | 204/32 |
| 4,751,677 A | 6/1988 | Daughton et al. | 365/158 |
| 5,173,873 A | 12/1992 | Wu et al. | 365/173 |
| 5,561,368 A | 10/1996 | Dovek et al. | 324/252 |
| 5,565,236 A | 10/1996 | Gambino et al. | 427/130 |
| 5,585,986 A | 12/1996 | Parkin | 360/113 |
| 5,587,943 A | 12/1996 | Torok et al. | 365/158 |
| 5,640,754 A | 6/1997 | Lazzari et al. | 29/603.14 |
| 5,650,889 A | 7/1997 | Yamamoto et al. | 360/97.01 |
| 5,650,958 A | 7/1997 | Gallagher et al. | 365/173 |
| 5,652,445 A | 7/1997 | Johnson | 257/295 |
| 5,654,566 A | 8/1997 | Johnson | 257/295 |
| 5,686,837 A | 11/1997 | Coehoorn et al. | 324/252 |
| 5,929,636 A | 7/1999 | Torok et al. | 324/252 |
| 6,031,273 A | 2/2000 | Torok et al. | 257/421 |
| 6,169,292 B1 | 1/2001 | Yamazaki et al. | 257/157 |
| 6,469,927 B2 * | 10/2002 | Spitzer et al. | 365/173 |

OTHER PUBLICATIONS

Ranmuthu et al., *New Low Current Memory Modes with Giant Magneto–Resistance Materials.*, Apr. 13, 1993, DIGESTS of INTERnational MAGnetics Conference.

J.L. Brown, Member IEEE, A.V. Pohm Fellow IEEE., *1–Mb Memory Chip Using Giant Magnertoresistive Memory Cells.*, 4612A IEEE Transactions on Components, Packing, and Manufacturing Technology—Part A 17(1994) Sep., No. 3, New York, U.S., pp. 373–379, ©1994 IEEE.

J.M. Daughton, *Magnetoresistive Memory Technology.*, 2194 Thin Solid Films, 216 (1992) Aug. 28, No., Lausanne, CH., pp. 162–168.

Spong et al., *Giant Magnetoresistive Spin Valve Bridge Sensor.*, IEEE Transactions on Magnetic vol. 32, No. 2, Mar. 1996. pp. 366–371.

Mark Johnson, *Bipolar Spin Switch*, Apr. 16, 1993, Bellcore, Red Bank, NJ, vol. 260., pp. 320–323.

Paul A. Packan., *Pushing the Limits*, Perspective Device Physics., Sep. 24, 1999, vol. 285, pp. 2079–2081.

*The All–Metal Spin Transistor.*, Advanced Technology/Solid State, IEEE Spectrum May 1994., pp. 47–51, ©1994 IEEE.

* cited by examiner

Primary Examiner—Son T. Dinh
(74) Attorney, Agent, or Firm—Beyer Weaver & Thomas, LLP

(57) ABSTRACT

A sample-and-hold circuit is described which includes a network of thin-film elements in a bridge configuration. Each of the thin-film elements exhibits giant magnetoresistance. The circuit also includes a plurality of conductors inductively coupled to each of the thin-film elements for applying magnetic fields thereto. The circuit is operable using the plurality of conductors to sample and store a value corresponding to an input signal.

42 Claims, 13 Drawing Sheets

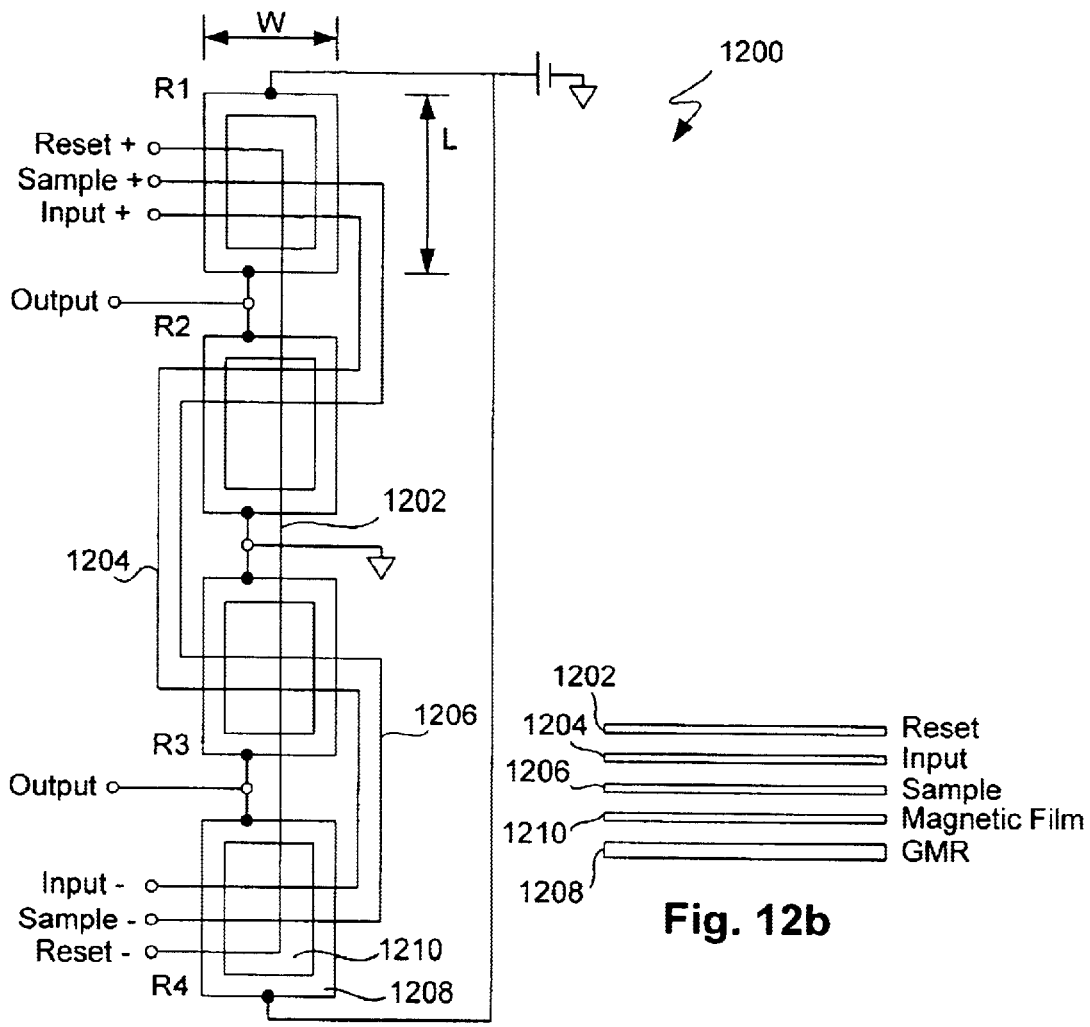
Fig. 12a
Fig. 12b
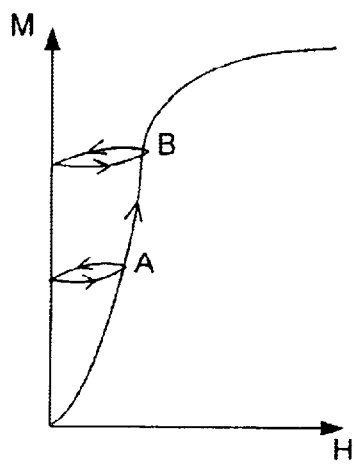
Fig. 13a
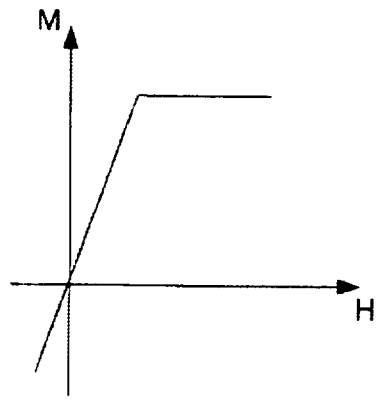
Fig. 13b

TRANSPINNOR-BASED SAMPLE-AND-HOLD CIRCUIT AND APPLICATIONS

RELATED APPLICATION DATA

The present application claims priority from U.S. Provisional Patent Application No. 60/278,323 for ELECTRONIC AND MICROELECTROMECHANICAL DEVICES AND SYSTEMS EMPLOYING GIANT MAGNETORESISTIVE FILMS filed on Mar. 23, 2001, the entire disclosure of which is incorporated herein by reference for all purposes.

BACKGROUND OF THE INVENTION

The present invention relates to circuits and systems incorporating solid-state devices referred to herein as "transpinnors" and described in U.S. Pat. Nos. 5,929,636 and 6,031,273, the entire disclosures of which are incorporated herein by reference for all purposes. More specifically, the present application describes a transpinnor-based sample-and-hold circuit and various applications thereof.

The vast majority of electronic circuits and systems manufactured and sold today are based on semiconductor technology developed over the last half century. Semiconductor processing techniques and techniques for manufacturing integrated circuits have become increasingly sophisticated resulting in ever smaller device size while increasing yield and reliability. However, the precision of such techniques appears to be approaching its limit, making it unlikely that systems manufactured according to such technique will be able to continue their historical adherence to Moore's Law which postulates a monotonic increase in available data processing power over time.

In addition, as the techniques for manufacturing semiconductor integrated circuits have increased in sophistication, so have they correspondingly increased in cost. For example, current state-of-the-art integrated circuits require a large number of processing steps to integrate semiconductor circuitry, metal layers, and embedded circuits, an issue which is exacerbated by the varied nature of the materials being integrated. And the demand for higher levels of complexity and integration continue to grow. The technical difficulties facing the semiconductor industry are well summarized by P. Packan in the Sept. $24^{th}$, 1999, issue of Science magazine beginning at page 33, incorporated herein by reference in its entirety for all purposes.

Finally, there are some applications for which conventional semiconductor integrated circuit technology is simply not well suited. An example of such an application is spacecraft systems in which resistance to external radiation is extremely important. Electronic systems aboard spacecraft typically require elaborate shielding and safeguards to prevent loss of information and/or system failure due to exposure to any of the wide variety of forms of radiation commonly found outside earth's atmosphere. Not only are these measures costly in terms of dollars and weight, they are not always completely effective, an obvious drawback given the dangers of space travel.

In view of the foregoing, it is desirable to provide electronic systems which facilitate higher levels of integration, reduce manufacturing complexity, and provide a greater level of reliability in a wider variety of operating environments.

SUMMARY OF THE INVENTION

According to the present invention, electronic circuits and systems based on an all-metal solid-state device referred to herein as a "transpinnor" address the issues discussed above. More specifically, an embodiment of the present invention provides a sample-and-hold circuit based on the transpinnor which may be used in any larger circuit in which a conventional sample-and-hold circuit might be employed, e.g., an analog-to-digital converter.

Thus, the invention provides a sample-and-hold circuit which includes a network of thin-film elements in a bridge configuration. Each of the thin-film elements exhibits giant magnetoresistance and has a first magnetic film associated therewith which is operable to magnetically bias the associated thin-film element. The circuit also includes a plurality of conductors inductively coupled to each of the thin-film elements for applying magnetic fields thereto. The circuit is operable using the plurality of conductors to sample and store a value corresponding to an input signal.

According to another embodiment, the present invention provides a sample-and-hold circuit comprising a network of thin-film elements in a bridge configuration. Each of the thin-film elements exhibits giant magnetoresistance. A plurality of conductors are inductively coupled to each of the thin-film elements for applying magnetic fields thereto. The circuit is operable using the plurality of conductors to generate a substantially constant output current representative of an input signal using a remanent magnetization associated with at least one of the thin-film elements.

According to yet another embodiment, the present invention provides a sample-and-hold circuit comprising a network of thin-film elements in a bridge configuration. Each of the thin-film elements exhibit giant magnetoresistance. The circuit also includes a signal conductor operable to transmit an input signal, and a sample conductor operable to transmit a strobe signal. The signal and sample conductors are inductively coupled to selected ones of the thin-film elements. The circuit is operable to sample and store a value corresponding to the input signal in response to the strobe signal.

Various types of analog-to-digital converters employing the sample-and-hold circuits of the present invention are also provided. Electronic systems incorporating the sample-and-hold circuits and analog-to-digital converters are also within the scope of the invention.

A further understanding of the nature and advantages of the present invention may be realized by reference to the remaining portions of the specification and the drawings.

BRIEF DESCRIPTION OF THE DRAWINGS

FIG. 1b shows a typical resistance curve for a GMR film such as the one shown in FIG. 1a.

FIGS. 2c and 2d show two alternative structures for the multilayer GMR film of FIG. 2a.

FIG. 4 shows a transpinnor with a closed-flux configuration which is substantially the same schematically as the transpinnor of FIG. 3a.

FIG. 5 shows a transpinnor with an open-flux configuration which is substantially the same schematically as the transpinnor of FIG. 3a.

FIGS. 12a and 12b show a transpinnor configured as a sample-and-hold circuit according to a specific embodiment of the present invention.

FIGS. 13a and 13b illustrate the hysteresis and demagnetization effects of a magnetic thin film.

DETAILED DESCRIPTION OF SPECIFIC EMBODIMENTS

Reference will now be made in detail to specific embodiments of the invention including the best modes contemplated by the inventors for carrying out the invention. Examples of these specific embodiments are illustrated in the accompanying drawings. While the invention is described in conjunction with these specific embodiments, it will be understood that it is not intended to limit the invention to the described embodiments. On the contrary, it is intended to cover alternatives, modifications, and equivalents as may be included within the spirit and scope of the invention as defined by the appended claims. In the following description, numerous specific details are set forth in order to provide a thorough understanding of the present invention. The present invention may be practiced without some or all of these specific details. In addition, well known process operations have not been described in detail in order not to unnecessarily obscure the present invention.

"Giant magnetoresistance" (GMR) refers to the difference in the resistance that conduction electrons experience in passage through magnetic multilayer films which is dependent on the relative orientation of the magnetization in successive magnetic layers. For ferromagnetic materials, this difference occurs because the energy level for conducting electrons in a ferromagnetic layer is lower (by a few electron microvolts) for electrons with spin parallel to the magnetization rather than antiparallel. A GMR film is a composite structure comprising one or more multilayer periods, each period having at least two magnetic thin-film layers separated by a nonmagnetic conducting layer. A large change in resistance can occur in a GMR structure when the magnetizations in neighboring magnetic layers change between parallel and antiparallel alignments.

Figure 1A:
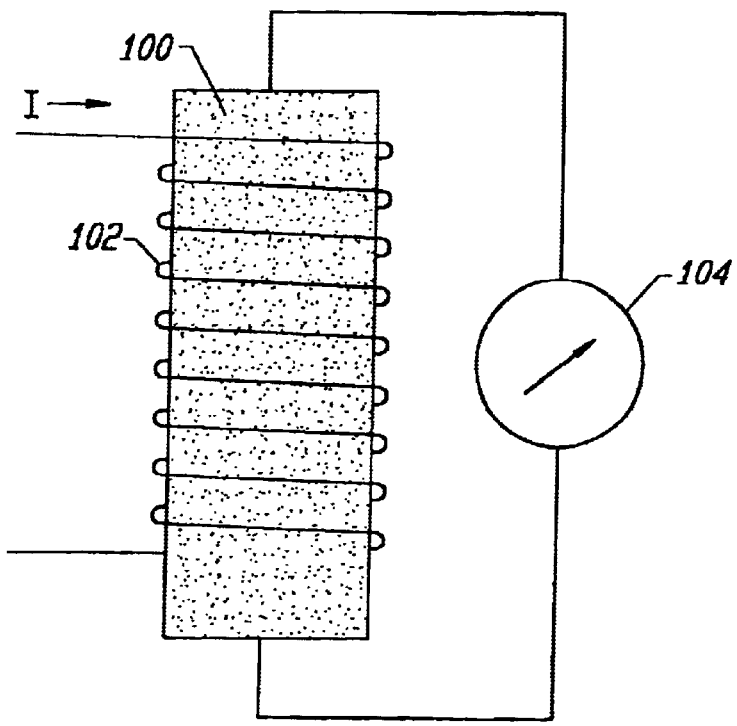
FIG. 1a shows a multilayer GMR film.

The property of giant magnetoresistance may be understood with reference to FIG. 1a which shows a multilayer GMR film 100 with a field coil 102 for supplying a magnetic field to GMR film 100. GMR film 100 contains magnetic layers of different coercivities separated by non-magnetic conducting layers (not shown). An ohmmeter 104 measures the resistance of GMR film 100 which changes as the input current I changes (see FIG. 1b); the dotted line represents the saturation of the high-coercivity film in the opposite direction to the solid line. As discussed above, if the magnetization direction of the magnetic layers of the first coercivity is parallel to the magnetization direction of the magnetic layers of the second coercivity, the resistance of the film is low. If the magnetization directions are antiparallel, the resistance is high.

Figure 1B:
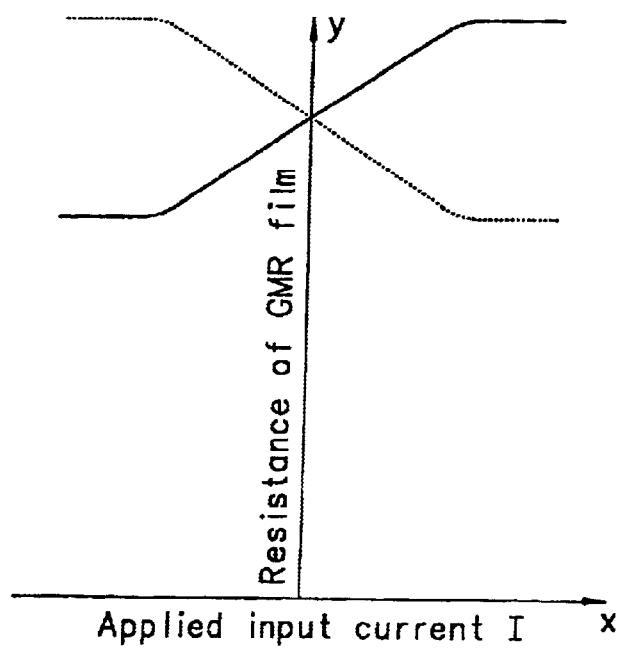

GMR film 100 may be formed of one or more periods, each period having, for example, a cobalt layer characterized by a moderate coercivity, a copper layer, a permalloy layer characterized by a lower coercivity than the cobalt layer, and another copper layer. The different coercivities of the alternating magnetic layers make it possible to achieve an antiparallel orientation of the respective magnetization directions. The copper layers physically separate the magnetic layers, which otherwise would be tightly coupled by exchange forces. Consequently, it is possible to switch the magnetization in the low coercivity film without switching the magnetization in the high coercivity film. FIG. 1b shows a hypothetical resistance curve for an input current I which is not sufficient to reverse the polarity of the higher coercivity cobalt layer. As the current is increased, more of the low coercivity film switches, thus increasing the resistance. When the entire low coercivity film is switched there is no further change in resistance and the resistance curve levels off.

Figure 2A:
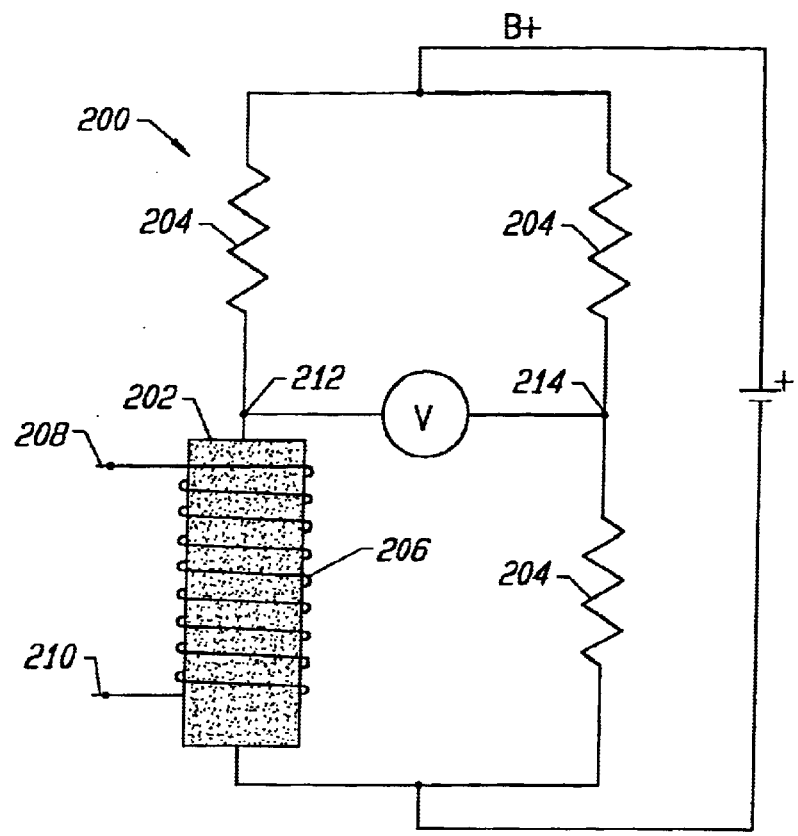
FIG. 2a is a schematic diagram of a first transpinnor configuration.
Figure 2B:
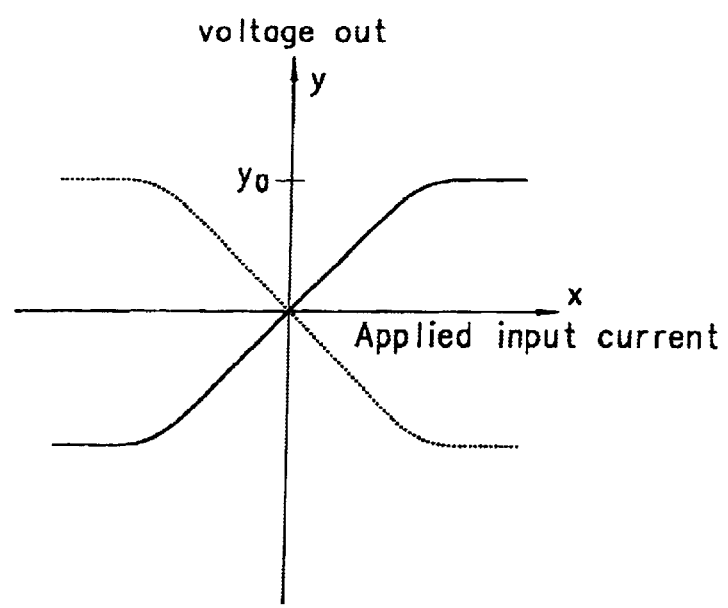
FIG. 2b shows a plot of the output voltage of the transpinnor of FIG. 2a as a function of input current.
Figure 2D:
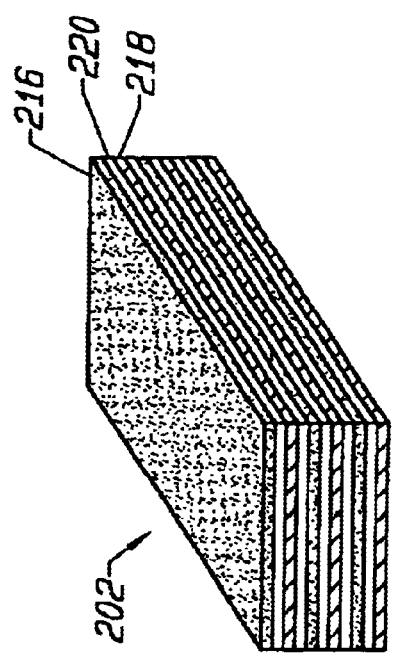
Figure 2C:
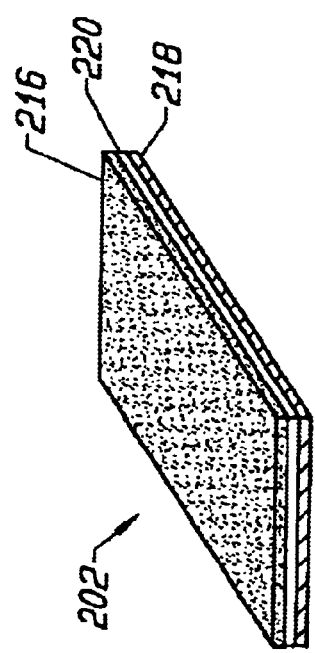

FIG. 2a shows a schematic diagram of a transpinnor 200 in which a GMR multilayer thin-film strip 202 is disposed in a bridge configuration with three resistive elements 204. A conductor 206 is wound around GMR film 202 for supplying a magnetic field thereto. An input signal is applied at terminals 208 and 210. Output terminals 212 and 214 give the output voltage, as indicated by a voltmeter. This configuration allows the output voltage to be zero as well as positive and negative. As is readily apparent, the input (between terminals 208 and 210) is completely isolated resistively from the output (between nodes 212 and 214) even for a DC input current I. The magnitude of the output is proportional to the applied B+ voltage and is limited only by the current carrying capacity of GMR film 202. FIG. 2b shows the output voltage of transpinnor 200 as a function of input current. If the values of resistors 204 are chosen correctly, the output voltage does not have a pedestal. That is, the curve crosses the y axis at y=0, and is not raised as in FIG. 1b. If the high coercivity film is reversed by either a strong input current or an external field, the polarity of the output is reversed, as shown by the dotted line in FIG. 2b. A single-period GMR film 202 and a three-period GMR film 202 are shown in FIGS. 2c and 2d, respectively, each having permalloy (216), cobalt (218) and copper (220) layers. The GMR films of FIGS. 2c and 2d illustrate that various transpinnor configurations may employ single period and multi-period structures.

As mentioned, the output of transpinnor 200 changes as the resistance of GMR film 202 changes and is proportional to the voltage drop across GMR film 202 as the current passes through it. The output can be bipolar or unipolar, depending on the ratios of resistances chosen for the other legs (i.e., the bias can be positive, negative, or zero). Also, depending on the squareness of the B-H loop, the output can either be linear or a threshold step function. In addition, if the GMR film 202 is constructed symmetrically about the center, the net magnetic field from the current passing through the film will be zero. Therefore, the only limits on magnitude of the current are the heating of GMR film 202 and/or electromigration. The GMR films may employ metals having high electromigration thresholds, such as copper, cobalt, nickel and iron.

Figure 3A:
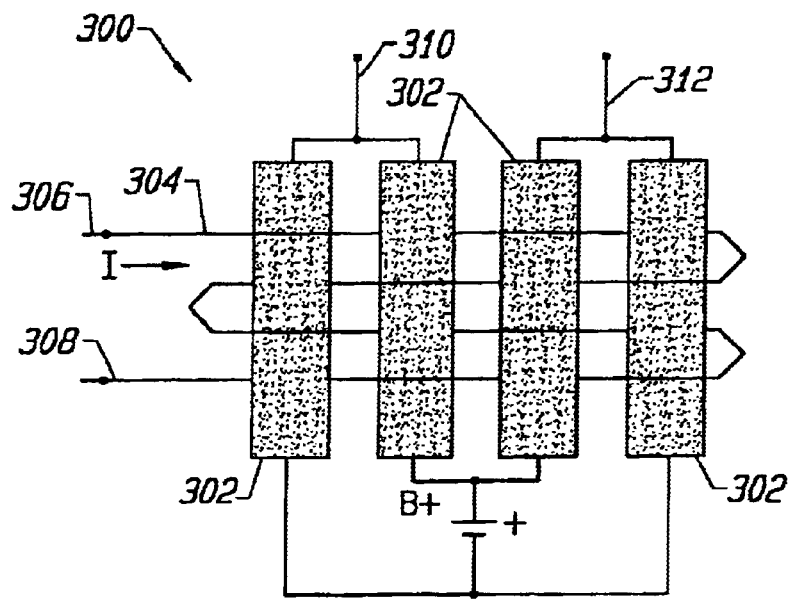
FIG. 3a is a schematic diagram of a second transpinnor configuration.
Figure 3B:
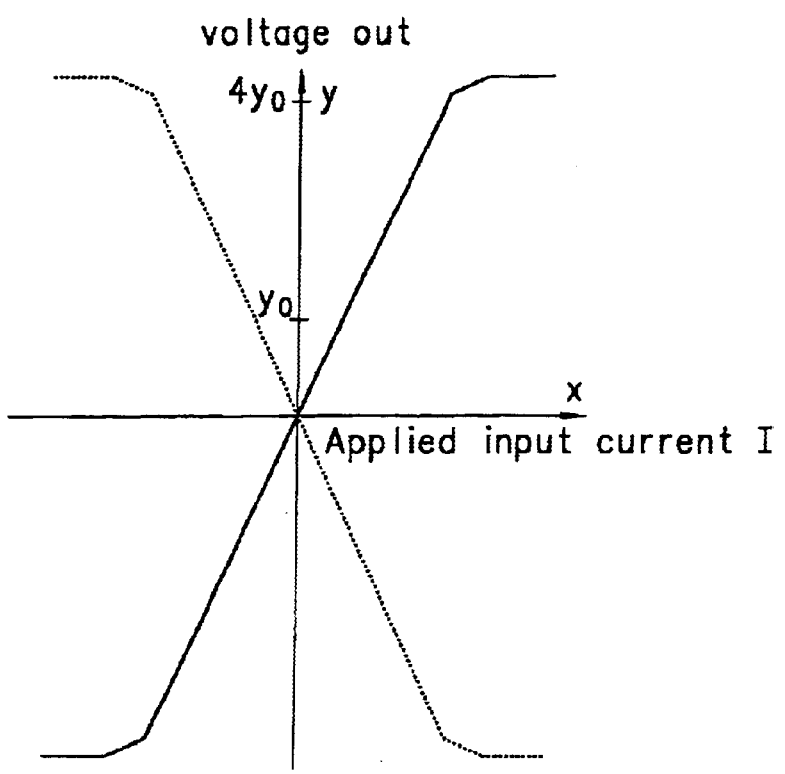
FIG. 3b shows a plot of the output voltage of the transpinnor of FIG. 3a as a function of input current.

FIG. 3a shows a schematic diagram of another transpinnor 300 having a different configuration. Instead of only one GMR film, transpinnor 300 employs four GMR films 302 arranged in a bridge configuration with conductor 304 wound through them for supplying a magnetic field thereto. As with transpinnor 200, the input of the device (between terminals 306 and 308) is isolated resistively from the output (between nodes 310 and 312) even with a DC input current. Also, the output voltage of transpinnor 300 is determined by the magnitude of B+ and the current carrying capacity of GMR films 302. As shown in FIG. 3b, transpinnor 300 has four times the output of transpinnor 200. Transpinnor 300 also has the advantage that the bridge is balanced to zero offset if all four films are identical.

Figure 4:
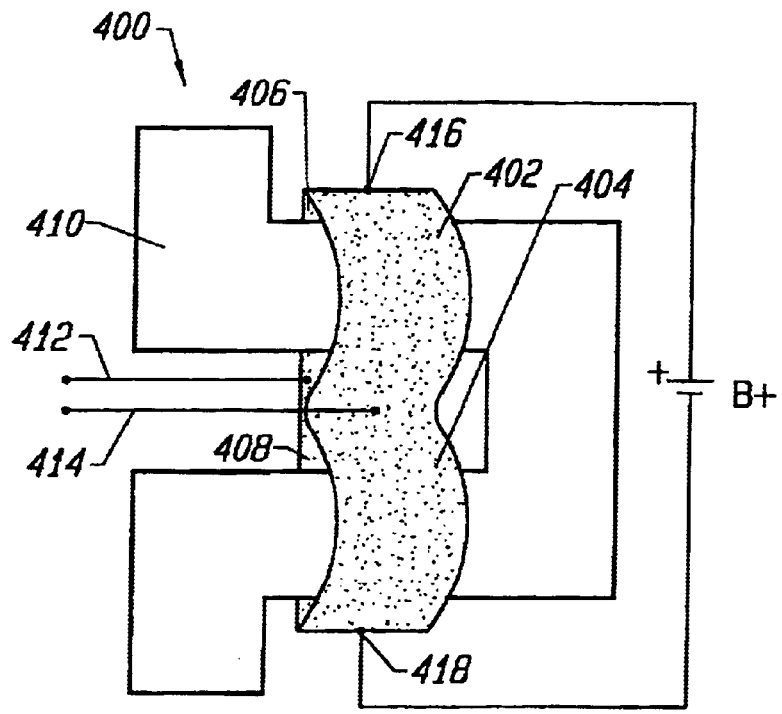

FIG. 4 shows a transpinnor 400 with a closed-flux geometry which is substantially the same schematically as transpinnor 300. There is insulation (not shown) in the middle of transpinnor 400 where top GMR films 402 and 404 nearly touch bottom GMR films 406 and 408. The four GMR films form a Wheatstone bridge in which the resistance of each is variable. Input conductor 410 supplies the magnetic field and the output voltage is provided by output conductors 412 and 414. A bias voltage B+ is applied between nodes 416 and 418.

Figure 5:
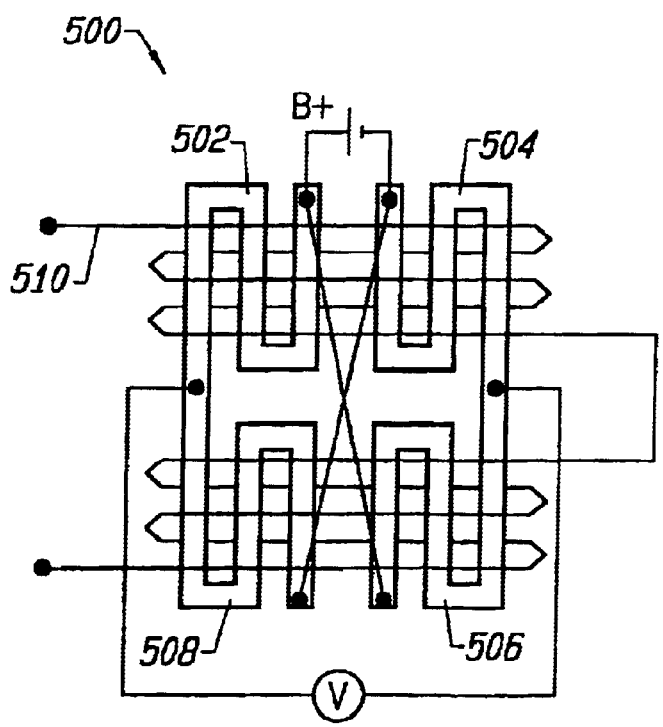

FIG. 5 shows a transpinnor 500 with an open-flux configuration which is substantially the same schematically as transpinnor 300. GMR film elements 502, 504, 506 and 508 form a Wheatstone bridge arrangement which requires only a single GMR deposition (i.e. the GMR layers are deposited in a single pump-down, with no patterning required between deposition of layers). Input conductor 510 was wound as a single layer of magnet wire. The closed-flux structure of FIG. 4 gives superior performance, especially for small-size devices, but involves multiple GMR depositions and patterning.

Figure 6:
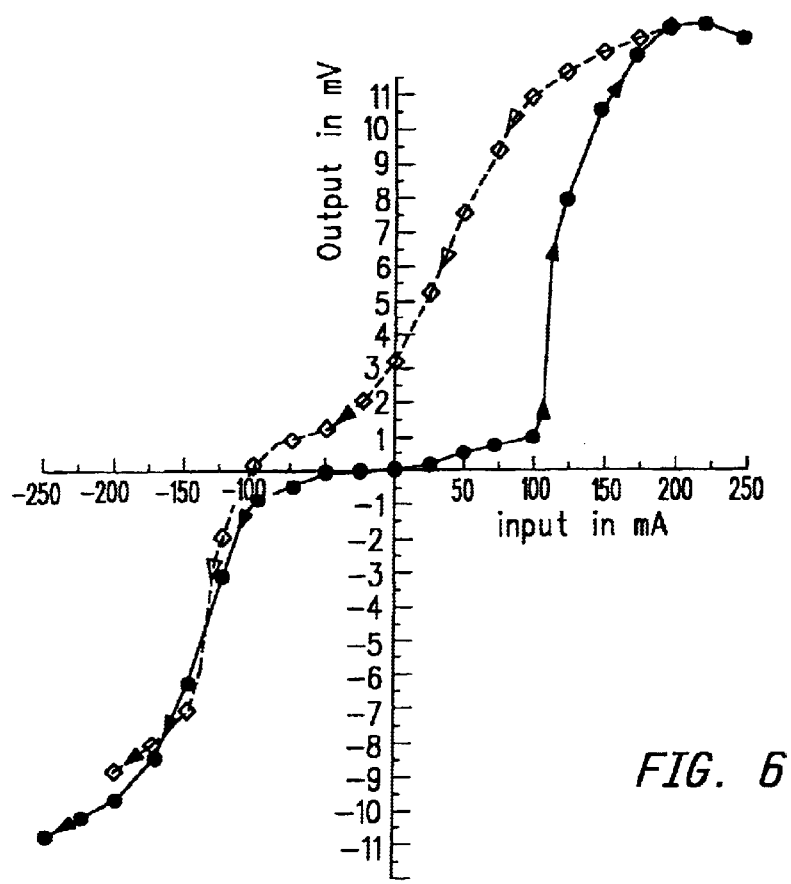
FIG. 6 illustrates the relationship between input current and output voltage for an all-metal GMR transpinnor.

FIG. 6 illustrates the relationship between input current and output voltage for the all-metal GMR transpinnor shown in FIG. 5. The transpinnor was first initialized by saturating its four GMR film elements along the easy axes (i.e., parallel to the direction of film strips) with a magnet, and then applying input current until the magnetization direction of the permalloy layers in two of the elements switch completely (i.e., for maximum output from a Wheatstone bridge two resistors must be in the high resistance state and two in the low resistance state). After initialization in this manner, the data for the curve of FIG. 6 were taken. The solid curves, both positive and negative, were taken starting from the initialized state. The dashed curve is the remagnetization curve in which the applied field is made more negative (starting from the state of maximum output) in order to reestablish the initial magnetization state.

The solid curve of FIG. 6 shows a flat portion near the origin, then a rapid climb in output voltage when the input current reaches a threshold. It will be understood that this flat portion and threshold are desirable for digital applications, such as logic or selection matrices. The flat portion of the curve is largely due to the exchange bias between the permalloy and the cobalt layers. For linear applications, this portion of the curve can be removed either by the application of a small external bias, or by creating a symmetrical spin valve structure in which two cobalt layers are magnetized in opposite directions.

Figure 7:
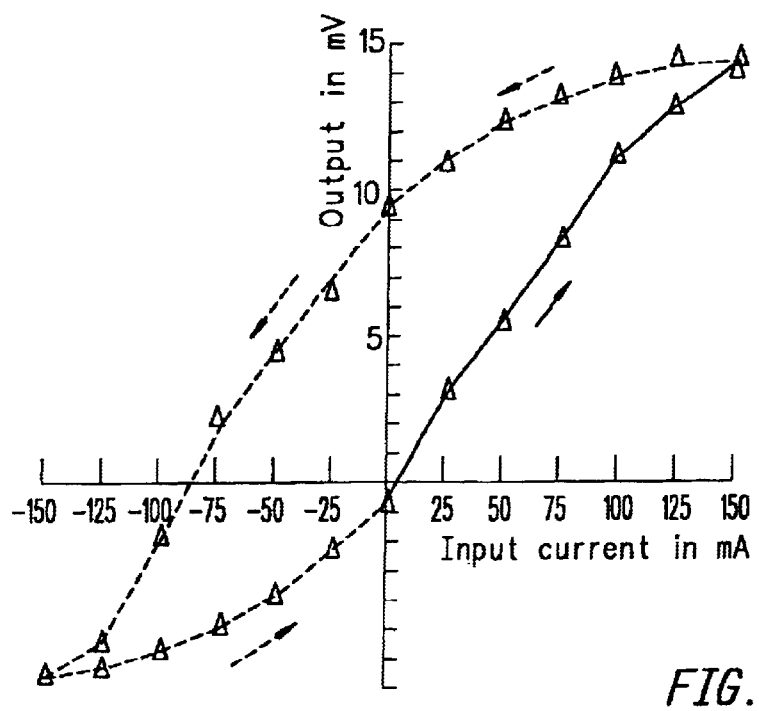
FIG. 7 shows output voltage vs. input current for the GMR transpinnor of FIG. 6 with a small external bias applied.

FIG. 7 shows an output voltage vs. input current curve for the GMR transpinnor of FIG. 6 but with a small external bias (e.g., 1.5 Oe) applied with a magnet in the easy direction (i.e., parallel to the film strips). As is evident, the exchange bias plateau around the origin has been essentially eliminated. As with FIG. 6, the solid lines begin with the initialized state, and the dashed line is the remagnetization curve. The finite hysteresis makes this transpinnor better suited for digital than for linear applications.

The GMR transpinnor of FIG. 6 has a rather large hysteresis in the permalloy of 1 Oe. However, permalloy coercivities of an order of magnitude smaller are found. This is of interest because the voltage and current gain of the GMR transpinnor are inversely proportional to the permalloy coercivity, and the power gain is inversely proportional to the square of the permalloy coercivity. The permalloy coercivity found in multi-period GMR films is routinely much lower than single-period GMR films. The reason is that the domain walls form in pairs in the closely spaced films of the multi-period devices, greatly reducing the magnetostatic energy of the walls. This is beneficial for linear applications because it increases the gain of the transpinnor. Unfortunately, a corresponding reduction in the coercivity of the cobalt layers is also found. This reduction is undesirable because at some point the magnetization direction of the cobalt layers begin to switch at a lower threshold than the magnetization direction of some of the permalloy layers. Obviously, the proper balance between these two parameters must be found for the particular application.

It is desirable in particular applications for the GMR transpinnor to have a gain greater than unity. The low-frequency gain of GMR transpinnors is a function of their fundamental parameters. Referring again to FIG. 5, input line 510 of transpinnor 500 is completely isolated from the output circuit. For the purpose of calculating the gain of transpinnor 500, let the input current be i, the input voltage be v, and the resistance of the input line be r. Furthermore, let the output voltage of transpinnor 500 be V, the resistance of the output circuit (including the GMR film) be R, and the current be I. Let us also introduce a variable to express the ratio of the percentage change in resistance caused by a small applied magnetic field. Where the shear is unimportant compared to the coercivity, this quantity, which we call the resistibility, X, is given by $$X = GMR/(100 H_c) \quad (1)$$

where $H_c$ represents the coercivity of the permalloy in the GMR film. The voltage gain of the GMR transpinnor of the present invention is proportional to the resistibility, and the power gain is proportional to the square of the resistibility.

The input line of the transpinnor produces a field. The ratio of field to the current by which it is produced is referred to herein as the coil efficiency, E. Generally speaking, the value of E increases dramatically as the size of the transistor decreases. If other parameters (including the resistance of the input line) stay the same, the voltage amplification is proportional to E, and the power amplification is proportional to the square of E.

Given the definitions of the various parameters of the transpinnor, the voltage amplification is given by $$A_{voltage} = (R/r) I E X \quad (2)$$

and the power amplification is given by $$A_{power} = (R/r) I^2 E^2 X^2 \quad (3)$$

From (1) and (3) it becomes evident that the power amplification of transpinnor 500 is proportional to the square of the current, to the square of the GMR, to the square of the drive line efficiency, and inversely proportional to the square of the coercivity of the GMR film.

Some numerical examples of power amplification may be instructive. According to a first example, the input resistance is 0.8 Ohms, the resistance of the GMR film elements is 120 Ohms, the resistibility is 0.011/Oe, and the coil efficiency is 20 Oe/amp. If an input current of 500 mA is used, according to (3), the power amplification is 1.8. This is not a particularly good film.

According to a second example, the parameters are the same as for the first example above, except that the resistibility is 0.19/Oe. Now the power amplification is 541. This is higher than desirable for a logic tree, but may be reduced to a desirable value by appropriately decreasing the current.

According to a third example, a miniaturized transistor is configured as shown in FIG. 4, with the width of its features being on the order of one micron. The copper input conductor is 1 micron thick and 3 microns long. The input resistance is 0.05 ohms, the output resistance is 8 ohms, the coil efficiency is 6000 Oe/amp, the resistibility is 0.19/Oe, and the current is 1 mA. The power amplification is then 208.

The conclusion is that substantial power amplification can be achieved with GMR transpinnors using existing GMR film configurations. Additionally, amplification factors in the hundreds can be obtained regardless of whether the transistors are large or so small as to be at the limits of conventional lithography because the power amplification factor is independent of the size of the device. However, although GMR transpinnors scale so their power amplification doesn't degrade when the devices are miniaturized, the power handling capability of the devices diminishes, of course, as the device size diminishes. GMR transpinnors can be designed to give either high output current and low output voltage, or high output voltage and low output current. These parameters are determined by the aspect ratio of the GMR film. If the GMR film is a long narrow conductor, the output is high voltage and low current. If the GMR film is a short wide conductor, the output is low voltage and high current. The power amplification is relatively independent of the aspect ratio.

To get high power amplification, the following may be done:

(1) Make the input stripline as thick as possible in order to lower the resistance r. The power amplification depends only linearly on r, so this is less critical than the other steps.

(2) Make the resistibility as high as possible, either by raising the GMR or by lowering the coercivity of the permalloy.

(3) Make the GMR films as thick as possible to allow higher current without electromigration problems. This means many periods (e.g., 15 periods has been employed to obtain GMR of 15%).

Although low GMR films with very low coercivity can be used to construct GMR transpinnors with high power amplification, the resulting device may be inefficient. If overall power consumption is a consideration, one should use high GMR films. It is possible, for example, to make GMR films with GMR of more than 22%.

There are a wide range of applications for which the transpinnor represents a significant advance. For example, transpinnors may be employed to implement nonvolatile logic gates, i.e., gates which maintain their states when power is removed. Additionally, because all-metal films exhibit much greater resistance to damage by radiation than semiconductors, transpinnors may be employed to implement intrinsically radiation-hard electronics.

The curve shown in FIG. 7 exhibits hysteresis. Although this is not harmful (and may indeed be useful) for logic devices, for linear transpinnor performance, the hysteresis loop needs to be closed and straightened in a finite operating region; additionally, films with very low-coercivity should be used. In general, the shape of the hysteresis loop of thin films depends on the direction of the applied fields. Different approaches to achieve anhysteretic GMR films for transpinnor operation in the linear region based on three methods of eliminating hysteresis and distortion from GMR films are described. One approach is the application of a transverse (i.e., perpendicular to the easy direction) bias field having a magnitude slightly larger than the anisotropy field of the low coercivity element; the signal to be amplified is applied as a varying easy-axis magnetic field. This bias field can be supplied by an external coil or magnet, by individually deposited magnets on each amplifier, or by a current in a stripline. The effect of the bias is to eliminate the hysteresis and to greatly increase the longitudinal permeability, as described in two publications, *Longitudinal Permeability in Thin Permalloy Films*, E. J. Torok and R. A. White, Journal of Applied Physics, 34, No.4, (Part 2) pp. 1064–1066, April 1963, and *Measurement of the Easy-Axis and $H_k$ Probability Density Functions for Thin Ferromagnetic Films Using the Longitudinal Permeability Hysteresis Loop*, E. J. Torok et al., Journal of Applied Physics, 33, No. 10, pp. 3037–3041, October, 1962, the entire disclosures of which are incorporated herein by reference for all purposes. The mathematics in these publications can be used to show that when a GMR film of resistance R, having one or more low coercivity layers (e.g. permalloy) with anisotropy field $H_k$, is biased with a hard axis field $H_t > H_k$, and to which a small easy axis field $dH_L$ is applied, the film will have a corresponding resistance change, dR, given by $$dR/dH_L = (GMR)R/(H_T - H_k) \qquad (4)$$

where GMR is the maximum resistance change, and $H_T$ must be larger than the maximum $H_k$ of any region of the film. This differential resistance change can be quite large if the inhomogeneity of the film is small, and the corresponding amplification can be large. This is a sensitive method of achieving anhysteretic GMR films by a transverse-biased permeability. It results in an analog signal with a linear response within a certain range.

In another approach to eliminating the hysteresis, the permalloy layer in the transpinnor is driven and sensed in the hard direction. The cobalt layer is deposited so that its easy axis is parallel to the hard axis of the permalloy this is accomplished by saturating the cobalt layer during its deposition at 90 degrees from the easy axis of the permalloy. This method does not generally require a bias field during operation; the exchange bias between the high coercivity layer(s) and the permalloy layer is normally sufficient to prevent the hard-axis loop from opening. The sensitivity of the hard-axis-driven film is not as good as in the approach based on the transverse-biased permeability (described above), but the linearity extends over a broader range and this method is easier to implement in that it avoids biasing in the hard direction and driving in the easy direction.

Yet another approach involves a sampling method. A pulse is applied to the transpinnor between each data sample. The pulse is of sufficient amplitude to saturate the permalloy layers in the transpinnor to an initial state that is the same regardless of whatever signal was applied in between. The frequency of the applied pulse should be higher than the highest frequency of interest in the signal to be amplified. The result of using narrow pulses to reinitialize the magnetic material before each data sample is to erase the magnetic history and to eliminate the hysteresis in the output. The output can be sensed either with sampling techniques or as an analog output with a low-pass filter.

It is generally understood that all possible electronic circuits, analog and digital, can be implemented using active components, e.g., transistors, in combination with four basic passive components, i.e., resistors, capacitors, inductors and transformers. It is also well known that neither inductors nor transformers are available in semiconductor bipolar technology. By contrast, the GMR transpinnors can be employed to provide both of these components. In fact, they are well suited to provide the basis of a variety of analog, digital and mixed general-purpose all-metal circuits, subsystems and systems. Since capacitance and resistance can be implemented with the same metal technology as that used for the passive transformer and the transpinnor, all these components can be combined very effectively on the same substrate to produce a comprehensive variety of all-metal circuits. Unlike semiconductor chips, whose performance suffers below a critical size, the characteristics of GMR devices improve as the dimensions are decreased.

Biased in the appropriate operating region, GMR transpinnors can be used as basic building blocks of logic gates, thereby providing the foundation for GMR-based digital electronics. While logic elements can be made with combinations of transpinnors, just as with transistors, there is another alternative. Various logic operations can be implemented with a single transpinnor. These transpinnors have more than one input line. Examples of such transpinnors are shown in FIGS. 8 and 9.

Figure 8:
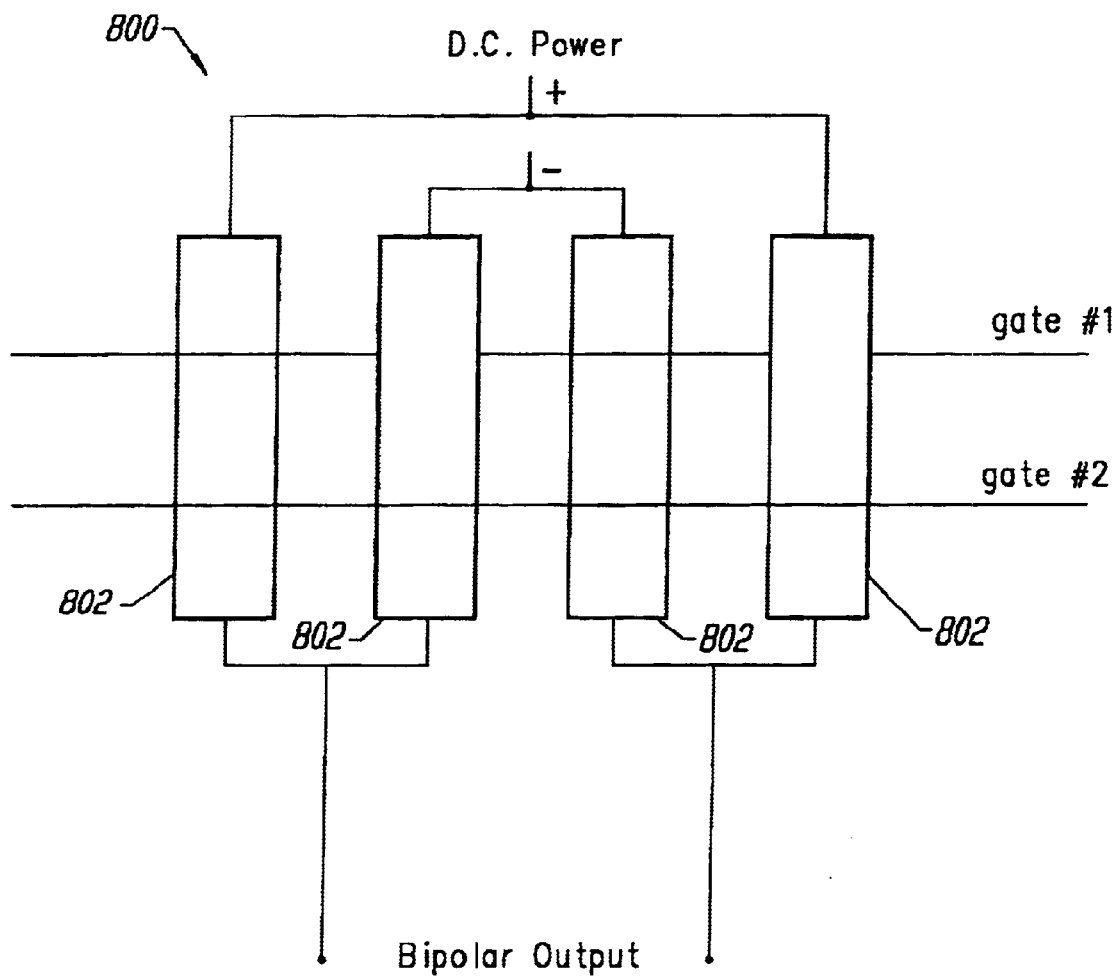
FIG. 8 shows a multiple-input transpinnor configuration.
Figure 9:
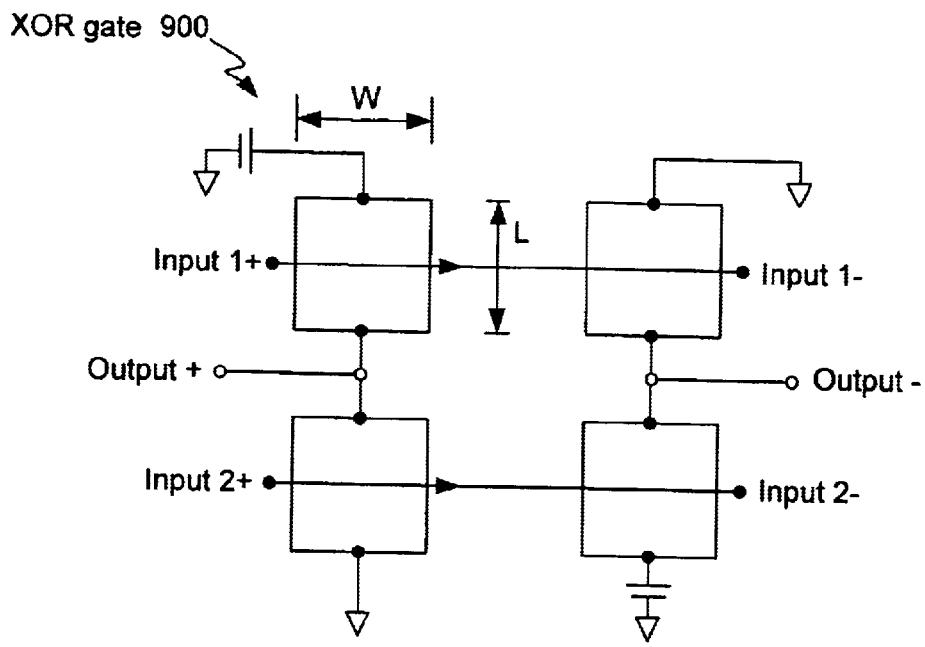
FIG. 9 is a circuit diagram of a transpinnor XOR gate.

FIG. 8 shows one such all-metal GMR transpinnor 800 and two drive lines. Four GMR films 802 are tied together in a folded Wheatstone bridge configuration. Each GMR film 802 is shown as a rectangular strip with its easy axis oriented in the long direction. Flux closure is also along the easy axis, but is not shown. The two drive lines (gates #1 and #2) are deposited conductor strips. The application of current on gate #2 tends to magnetize all four GMR films in the same direction. The application of current on gate #1 tends to magnetize adjacent GMR films oppositely. With the proper pulse combinations one can use half-select pulses to magnetize the high-coercivity layers positively or negatively in one direction, or to magnetize alternate strips in alternate directions.

As mentioned above, when a transpinnor is balanced, its output is zero. An input current which exceeds the threshold for switching a lower-coercivity layer in one or more of the GMR films can change the film resistance, thus unbalancing the transpinnor, resulting in an output signal. Particular types of logic gates can be realized from the basic transpinnor by specific configurations of input lines and by suitable choices of input current values. Additional characteristics affecting the operation of transpinnor logic gates include the choice of resistors through which a given input current passes, the current polarities in selected resistors, and the direction of the magnetic field produced by the input current relative to the magnetization of the lower-coercivity layers in the transpinnor.

Two procedures are useful in implementing logic gates with a single transpinnor. One involves setting the transpinnor threshold which is determined by the coercivity of the low-coercivity layers in the GMR film. Various ways of establishing the coercivity of a thin film are known in the art. Thus, the threshold is set by choosing or adjusting the coercivity of at least one of the low-coercivity layers in the GMR films of the transpinnor. The other procedure involves switching the polarity of the GMR films which is determined by the magnetization orientation of all the film layers. The polarity of the transpinnor is thus switched by reversing the direction of magnetization of all layers of all GMR films in the transpinnor.

According to various embodiments, the balancing of transpinnor GMR elements is accomplished using a technique known as magnetoresistive trimming in which the magnetization of selected GMR elements are manipulated to achieve the desired balance. Magnetoresistive trimming techniques are described in International Publication No. WO 02/05470 A2 entitled MAGNETORESISTIVE TRIMMING OF GMR CIRCUITS published Jan. 17, 2002, the entire disclosure of which is incorporated herein by reference for all purposes.

Logic operations which can be implemented with a single transpinnor include the following:

AND gate: A transpinnor will not switch unless the sum of fields from the input lines exceeds the switching threshold. An AND gate is defined as one that yields no output unless all of its inputs are logical "1"s. If the transpinnor has n input lines, and the amplitude of each input pulse is $(1/n)^{th}$ of the threshold, then the transpinnor is an AND gate.

NAND gate: This is the inverse of the AND gate and gives an output if and only if all inputs are zero. A transpinnor NAND gate is made similarly as the AND gate, by reversing the magnetization of all elements so that the gate will just switch if all n inputs are logical "0"s and not switch if one or more are a logical "1".

OR gate: The definition of an OR gate is one that gives an output if one or both inputs are a "1". This can be made by setting the threshold of a transpinnor such that a single input is sufficient to switch the film.

A practical problem is presented by the fact that different switching thresholds are required for different single transpinnor logic gates. There are, however, a variety of ways in which these thresholds may be adjusted for different types of gates on the same substrate. These include manipulation of the order of deposition because the order strongly influences the coercivity of both the low and high coercivity films. This method involves additional deposition steps. Another method of adjusting the switching threshold for a particular transpinnor is derived from the fact that the magnetic field from a current carrying stripline depends on the width of the strip line.

NOR gate: The definition of a NOR gate is one that gives an output if one or both inputs are a "0". This is merely the inverse of an OR. This can be done by reversing the polarity of the GMR films as in the above case of a NAND.

NOT gate: A NOT gate is an inverter that changes the polarity of an input pulse from positive to negative and vice versa. This is easily done with a transpinnor by reversing the polarity of the input winding, or by interchanging the power terminals.

Exclusive OR (XOR) gate: This is a gate that gives an output if one and only one of the inputs is a "1". This can be done with a transpinnor such that one input is sufficient to switch the low-coercivity element, yielding an output, while two or more pulse inputs yield a field large enough to switch the high-coercivity element as well, yielding zero output. The gate must be reset after each use.

A circuit diagram of a transpinnor-based XOR gate 900 is shown in FIG. 9. As shown, input current 1 goes through resistors R1 and R3 and input current 2 goes through resistors R2 and R4. If the currents in both inputs are less than the switching threshold, the output is zero. If the current in one and only one of the two input currents is above this threshold, then the resistance of either pair of resistors changes, the transpinnor becomes unbalanced, and an output signal is generated. If both input currents are above the switching threshold, all four resistors change equally (if properly trimmed), the transpinnor remains balanced, and the output signal is zero.

For digital applications, transpinnors with sharp thresholds and square-pulse outputs are desirable. For analog applications, a linear response is better. Transpinnors operating in the linear region can be used to develop a full complement of basic analog circuits, sufficient to create general-purpose analog circuitry based on GMR films.

A specific example of a transpinnor operating in the linear region for application to signal amplification illustrates some of the unique advantages of the dual functionality of the transpinnor over silicon technology. Differential amplifiers are typically used to eliminate common-mode signal and common-mode noise within the frequency range of their operation. As discussed above, the range of operation of the transpinnor in its transformer function extends from (and including) dc to the high-frequency cutoff limit. The GMR transpinnor can advantageously be utilized in its transformer function to remove common-mode signal in the differential-input mode, as well as in its transistor function to amplify a low signal in the single-ended output mode. In low-signal amplification, GMR transpinnors have the additional advantage of eliminating the problem of offset voltage at the input that is so troublesome in silicon integrated circuits. It should be noted that a high premium is paid in silicon technology to achieve low-offset input voltage for integrated differential amplifiers. That is, low-offset input voltage is achieved in silicon circuits only at the expense of degrading other parameters. No such price is associated with the use of transpinnors because of their dual transformer/transistor properties. Specifically, the input signal is applied to a differential input having the properties of a transformer primary with an additional advantage of flat low-frequency response inclusive to dc. The output signal is amplified by an output having transistor properties. Transpinnors are thus especially well suited as differential amplifiers.

Figure 10:
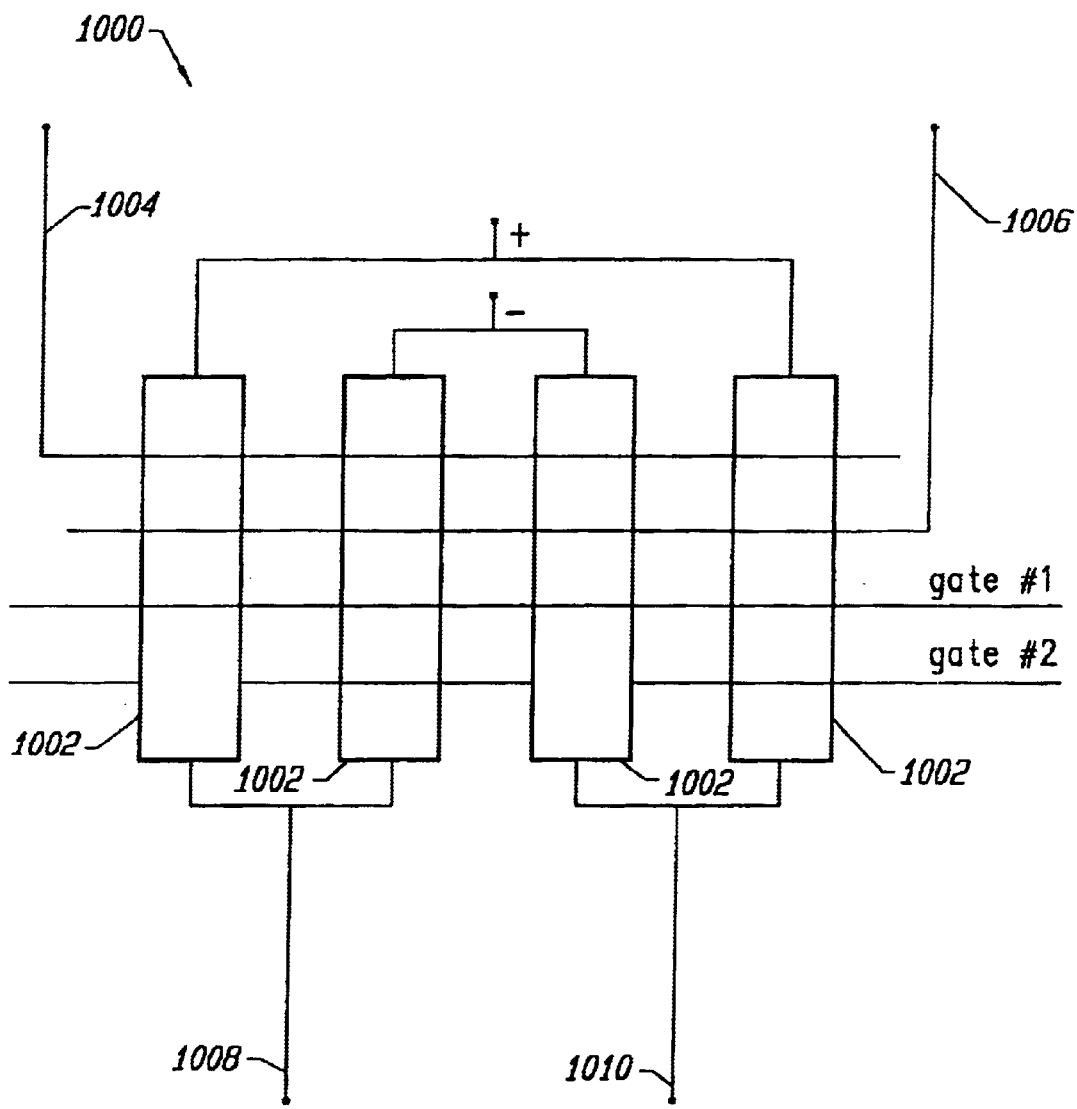
FIG. 10 shows a transpinnor configured as a gated GMR differential amplifier.

FIG. 10 shows a gated GMR differential amplifier 1000. Once again, four GMR films 1002 are arranged in a Wheatstone bridge configuration. Two input lines 1004 and 1006 supply a switching field to the permalloy layers in GMR films 1002. If the signals on lines 1004 and 1006 are identical, no switching takes place and the output (between nodes 1008 and 1010) is zero. Any common mode noise is thus rejected. All four lines (gate lines #1 and #2 and input lines 1004 and 1006) are electrically isolated, i.e., there is no electrical connection between them or to GMR films 1002 in gated differential amplifier 1000.

Since transpinnors are current driven devices, an important parameter is the output current of a given transpinnor for a given input current. This determines whether one transpinnor can switch another, for example, or how much amplification can be achieved. Of particular interest is the dependence of the amplification factor $A=i_{out}/i_{in}$ on the power supply to the transpinnor and on its parameters. This relationship is given by:

$$A=\pi 1000\ gmr\ VL/(H_c w^2 R_{sq}) \quad (5)$$

where V is the power supply voltage in volts, gmr is the fractional GMR value of the film (i.e., the GMR value is normally quoted as a percentage), $H_c$ is the coercivity in Oe, w and L are the GMR strip width and length in microns, and $Rsq=r/(L/w)$ is the sheet resistivity in ohms per square of a GMR film with resistance r (ohms per square is a standard term in thin film technology because the resistance from edge to edge of a thin film square is independent of the size of the square.)

The field H produced by $i_{in}$ in a stripline of width w is given by:

$$H=2\pi i_{in}/w \quad (6)$$

and $i_{out}$ is given by:

$$i_{out}=10^3\ gmr\ v/(2r) \quad (7)$$

where H is in Oe, $i_{in}$ and $i_{out}$ are in mA, w is in microns, and V is in volts.

Many transpinnor-based devices require one transpinnor to switch another transpinnor. Examples include a transpinnor shift register, a transpinnor selection matrix, and a transpinnor multistage amplifier. When a transpinnor is used to switch another transpinnor, the output current of the switching transpinnor becomes the input current of the transpinnor to be switched. A single transpinnor can readily switch multiple transpinnors as shown by the following numerical examples of the performance characteristics of several transpinnor-based devices:

1) shift register: In a transpinnor shift register, one transpinnor switches an identical transpinnor which, in turn, switches another identical transpinnor, an so on. An amplification factor of 1 is required. For w=L=5 microns, $H_c$=1 Oe, gmr=0.06, and $R_{sq}$=6 ohms per square, a power supply voltage of 0.168 is required (see equation (5)).

2) amplifier: For a power supply voltage of 3 volts on a chip, with the other parameters the same as for example 1 above, the amplification factor is 18.

3) branching logic: For the same parameters as in example 2, one transpinnor can switch a total of 18 other transpinnors.

4) smaller transpinnors: If, from the examples above, w and L were both reduced by a factor of 5 to 1 micron, the required voltage for an amplification factor of 1 would also be reduced by a factor of 5 to 33.6 mV. Thus, for a 3 volt supply, an amplification factor of 90 can be achieved.

5) different aspect ratios: For L=5 microns (as in example 1) and w=1 micron, the required voltage for an amplification factor of 1 is reduced to 6.7 mV.

6) single-transpinnor comparator design: a comparator is a high gain differential amplifier, easily saturated, e.g., FIG. 10; For L=10 microns, w=1 micron, V=0.2 volt, Hc=1 Oe, gmr=0.06, and Rsq=6 ohms/sq for the GMR films, the amplification factor is 63 according to equation (5), and the output current of the comparator is 0.1 mA according to equation (7). For decoder logic with w=0.5 micron, the magnetic field applied to the decoder logic is 1.26 Oe according to equation (6), large enough to drive the decoder logic.

7) comparator power dissipation: For the same parameters as in example 6, the resistance of each GMR element of the transpinnor is 60 ohms. This is the effective resistance between the power supply and ground of the transpinnor. For a supply voltage of 0.2 volt, the power dissipation of the comparator is $\{(0.2\ volts)^2/60\ ohms\}$=0.67 mW.

The foregoing examples illustrate that even transpinnors with modest GMR values can achieve enough gain to perform the analog and logic functions required to implement a wide variety of circuits including, for example, an analog-to-digital converter as will be described below.

Figure 11:
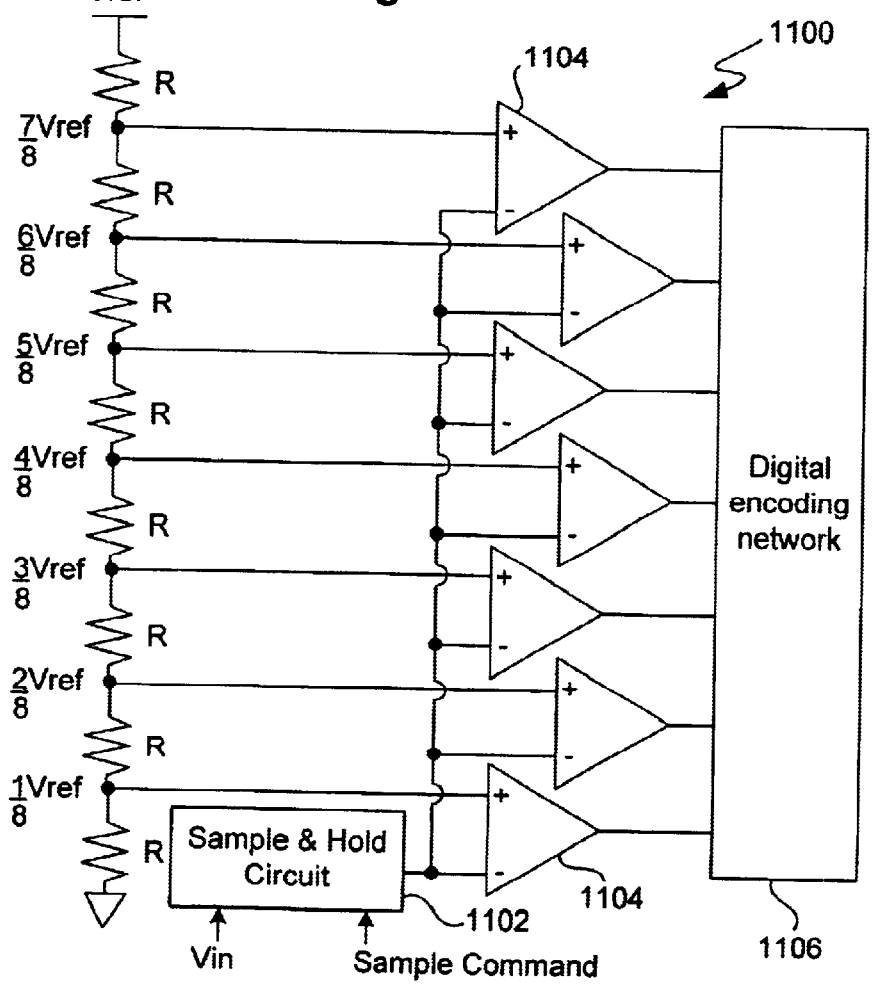
FIG. 11 shows the architecture of a parallel analog-to-digital converter (ADC).

There are three basic analog-to-digital conversion methods: (1) the parallel (flash) method; (2) the weighting (successive approximation) method; and (3) the counter method. In general, these methods differ in the number of stages required to get the final result, the number of reference voltages, and the number of comparators. FIG. 11 shows the architecture of a parallel analog-to-digital converter (ADC) 1100. The main components of an ADC will be identified with reference to this architecture.

ADC 1100 includes a sample-and-hold (S/H) circuit 1102 which is used to capture the value of the input signal Vin in response to a sampling command, and hold it at its output until the arrival of the next sampling command. A quantizing circuit comprising a string of resistors R divides the voltage differential between two references (Vref and ground) into a finite number of values (shown here as ⅛ Vref to ⅞ Vref). A plurality of comparators 1104 simultaneously compare the sampled value of the input signal against each of the quantized levels of the reference voltage. A digital encoding network 1106 converts the outputs of comparators 1104 to a binary format, i.e., a plurality of digital signals, representing the input signal.

Parallel ADCs (e.g., ADC 1100) typically have a single stage and are the fast type of ADC. However, they dissipate a considerable amount of power. This inefficiency can be considerably reduced with only a small sacrifice in speed by combining the parallel and weighting method architectures into what is known as the half-flash method architecture. However, even though the half-flash architecture reduces the overall circuit complexity by reducing the number of comparators, the complexity of the remaining comparators remains an issue. Thus, as will be described, the present invention provides an ADC architecture which takes advantage of transpinnor technology to significantly reduce the complexity and power dissipation relative to that of conventional ADC architectures.

FIGS. 12a and 12b show a 3-input transpinnor configured as a sample-and-hold (S/H) circuit 1200 according to a specific embodiment of the present invention. GMR elements R1–R4 are interconnected in a Wheatstone bridge configuration with 3 input conductors, reset conductor 1202, input conductor 1204, and sample conductor 1206. As shown in FIG. 12b, each of GMR elements R1–R4 includes a GMR film 1208, a portion of reset conductor 1202, a portion of input conductor 1204, and a portion of sample conductor 1206. According to various embodiments, GMR film may comprise one or more periods of alternating magnetic and nonmagnetic layers. In one embodiment, there is an additional magnetic film, 1210, included; in another, this film is absent.

Consider first an embodiment without the additional magnetic film, 1210. When a sample is to be performed, a current pulse is sent down the sample conductor. This current produces an easy axis field that is almost, but not quite, strong enough to cause the low coercivity layer (e.g. permalloy) in the GMR films 1208 to start to switch. An additional current in the input line 1204 will cause the low coercivity layer(s) in the GMR film to switch partially. Then the pulse in the sample conductor is switched off. The low coercivity layer(s) remains partially switched, and any changes in the current in the input conductor will not be strong enough to cause further switching while the sample pulse is off. The fact that the low coercivity layer(s) is partially switched causes the resistance of the GMR films to be different and thus the bridge is unbalanced. This causes an output that remains constant until another sampling operation is performed.

The film must be reinitialized before the next sampling operation. This is done with the reset conductor 1202. In the reset operation, a current pulse strong enough to restore the low coercivity layer(s) to a specified state is applied. This assures that the next sample operation will produce a reading that is independent of the previous reading. This reset can be done with either an easy axis field, a hard axis field, either single polarity or bipolar with decreasing amplitude to assure a repeatable starting state. In the exemplary configuration of FIG. 12, the reset conductor applies a hard axis field.

The above-described mode of operation assumes that the high coercivity (e.g. cobalt) layer(s) is not disturbed during any of these pulses.

Consider next a second embodiment in which the function of the sample conductor is performed by the reset conductor 1202. At the time the sample is to be taken, the reset conductor is pulsed with an amplitude sufficient to saturate the low coercivity layer(s) in the hard direction. An easy axis bias field that compensates for a coupling between the high coercivity and low coercivity layer(s) is supplied by a bias current in the sample conductor. When the current in the reset conductor falls to zero, the magnetization in the low coercivity layer(s) falls back to become aligned parallel or antiparallel to the easy axis. Which direction it falls is determined by the total easy axis field at the time of the fall. The magnetization ends up parallel to the direction of the total easy axis field during the fall, specifically, the direction of the easy axis field when the hard axis field equals the anisotropy field of the low coercivity layer(s). After the fall, the low coercivity layer(s) remains stable until the next pulse on the reset conductor. The information stored in the GMR film is then read out as before.

In actuality, there is inhomogeneity in the local easy axis direction and imperfections in the GMR film that cause a stray easy axis field that varies from point to point in the film. Thus when the pulse falls, some of the low coercivity layer magnetization rotates clockwise and some counterclockwise, and the film ends up demagnetized. The percentage that is magnetized in one direction depends on the magnitude of the net field in that direction during the fall. Thus the output of the transpinnor represents a quantitative measure of the magnitude of the current in the input line during the fall.

There is a third embodiment that includes a magnetic film 1210 disposed between GMR film 1208 and conductors 1202–1206. This is used to apply a constant magnetic field parallel to the easy axis of GMR film 1208 even after the sample signal applied via sample conductor 1206 goes to zero. This maintains the output current of S/H transpinnor 1200 constant until the next sample arrives. This is made possible by the hysteresis effect of magnetic thin films. What is actually stored or "held" by S/H circuit 1200 is the remanent magnetization which biases, i.e., is applied to, GMR films 1208. This remanent magnetization is proportional to the input current during the sample interval. It therefore causes transpinnor 1200 to output a current which does not change until the arrival of the next sample. The hysteresis effect of a magnetic field applied parallel to the easy axis of a magnetic thin film is illustrated in FIG. 13a.

According to a specific embodiment, and to ensure a common starting point for each new sample, S/H circuit 1200 is demagnetized by applying a magnetic field perpendicular to the easy axis of the magnetic film 1210 using reset conductor 1202. The demagnetization effect of a magnetic field applied perpendicular to the easy axis of an ideal magnetic thin film is illustrated in FIG. 13b. The y-axis is the component of the magnetization in the hard direction. In practice, some hysteresis exists even in the hard axis because of the energy of domain walls. Therefore a diminishing set of bipolar pulses may be employed.

The operation of a specific implementation of S/H circuit 1200 will now be described. Referring back to FIG. 12a, a current pulse is sent through reset conductor 1202, generating a magnetic field perpendicular to the easy axis of magnetic film 1210 thereby demagnetizing it. A current pulse is then sent through sample conductor 1206 to magnetize magnetic film 1210 to a sufficiently large value such that films R1 and R3 just begin to switch (point A in FIG. 7a). If no current flows in input conductor 1204, S/H transpinnor 1200 remains balanced and no current flows from its output.

However, if current is flowing in input conductor 1204, magnetic film 1210 is magnetized to a larger value (point B in FIG. 7a), R1 and R3 switch, S/H transpinnor 1200 becomes unbalanced, and current flows from its output. The current in sample conductor 1206 is then reduced to zero, but the magnetization of magnetic film 1210 remains constant due to the hysteresis illustrated in FIG. 7a. That is, the output current of S/H transpinnor 1200 remains constant even though the input current could be changing.

According to a specific embodiment, the magnetic field generated by sample conductor 206 is much larger than the magnetic field generated by input conductor 1204. This ensures that when the current in sample conductor 1206 is reduced to zero, the magnetic field applied to magnetic film 1210 from any current in input conductor 1204 is not sufficient to change the film magnetization. In this way, a suitably configured transpinnor can operate as a S/H circuit.

Figure 14:
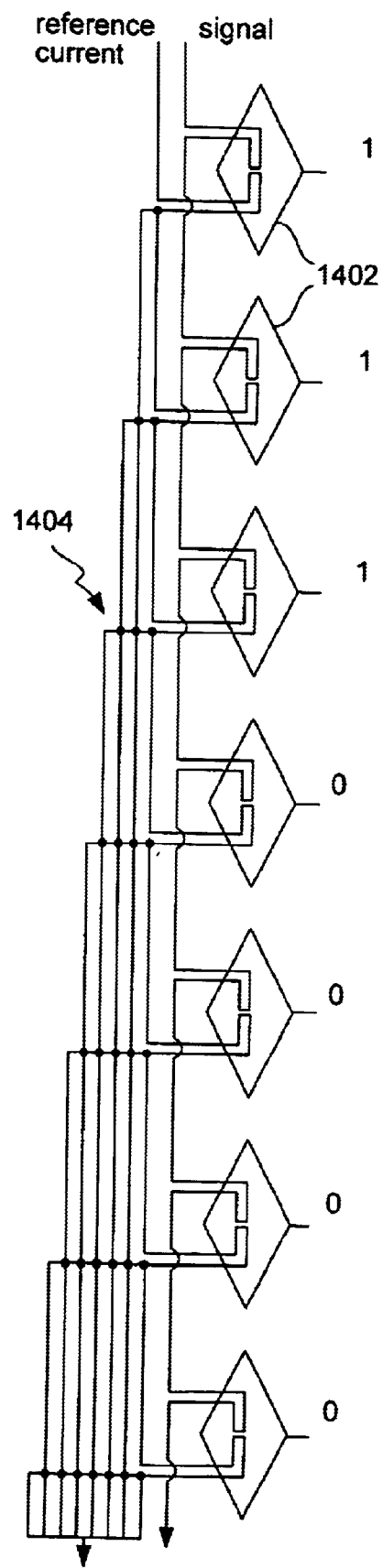
FIG. 14 shows a portion of a parallel ADC designed according to a specific embodiment of the invention.

An analog-to-digital converter (ADC) employing a transpinnor-based S/H circuit, e.g., S/H transpinnor 1200, and various other transpinnor-based electronics will now be described. FIG. 14 shows a portion a parallel ADC designed according to a specific embodiment of the present invention. As described above, in a conventional semiconductor ADC, a network of resistor supplies a reference voltage to each of a plurality of comparators. By contrast, and according to the embodiment shown in FIG. 14, different portions of an externally supplied reference current are provided to each of a plurality of transpinnor-based comparators 1402 via a current divider network 1404. As mentioned above, a transpinnor-based comparator is a differential amplifier (e.g., see FIG. 10) whose output saturates easily. One of the inputs is a reference current. The output is positive if the other input current is larger than the reference current, and negative if the other input current is less than the reference current.

According to one embodiment, current divider 1404 may be realized by progressively dividing the striplines providing the current to comparators 1402 so that each successive comparator receives a smaller portion of the current than the previous comparator. According to an alternative embodiment, the current divider is realized using different stripline widths in which the current density is inversely proportional to the width. According to more specific embodiments, the different reference currents delivered to adjacent comparators are equidistant from one another.

Figure 15:
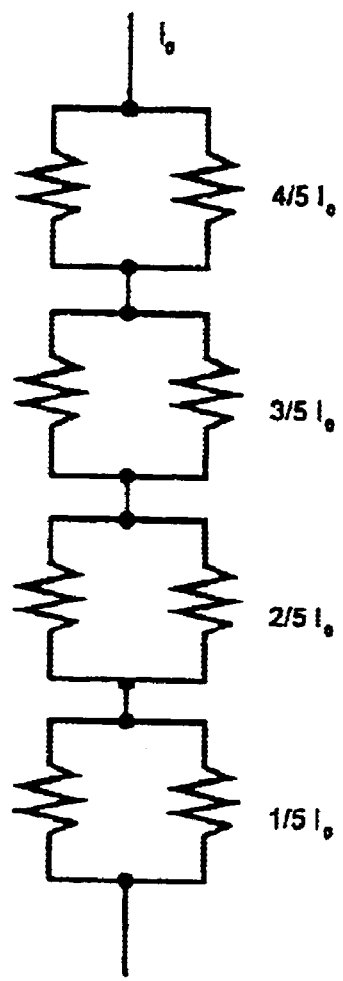
FIG. 15 shows a current quantizing circuit for use with various embodiments of the present invention.

According to another alternative embodiment, a current quantizer which may be employed with a transpinnor-based ADC designed according to the invention is shown in FIG. 15. The resistors in the network are chosen so as to generate five current levels which are integral multiples of the lowest current level from reference current $I_0$, e.g., $\frac{1}{5}I_0$, $\frac{2}{5}I_0$, $\frac{3}{5}I_0$, $\frac{4}{5}I_0$, and $I_0$.

The signal line supplies the output current of the S/H circuitry to the other input of each comparator 1402. By properly setting the thresholds for each successive comparator, different levels of input current will result in the outputs of comparators 1402 being set to either "0" or "1." As shown in FIG. 14, these outputs represent the input level as a thermometer code which is converted to a binary code by a digital decoding network (not shown). According to various embodiments, conventional digital decoding network designs may be implemented using transpinnor technology as described herein.

According to a specific embodiment of a 12-bit ADC designed according to the invention, a single-transpinnor S/H circuit is used to quantize the analog input signal, 4095 comparators to convert the quantized input to thermometer code, and a two-level magnetoelectronic digital decoding network to convert the comparator outputs to binary code. Thus, the input signal passes through four levels of transpinnors to effect the conversion. For a 500 ps switching time, the total delay through the ADC is roughly 2 ns, or a sampling rate of roughly 500 Msps. Because the comparator stage accounts for more than 95% of the transpinnors in such a 12-bit ADC, the power dissipation for such a device can be estimated from the information discussed above with reference to the numerical examples for transpinnor-based comparators. Using these numbers, the estimated power dissipation for a 12-bit, transpinnor-based ADC with a sampling rate of 500 Msps is roughly 2.7 W.

Figure 16:
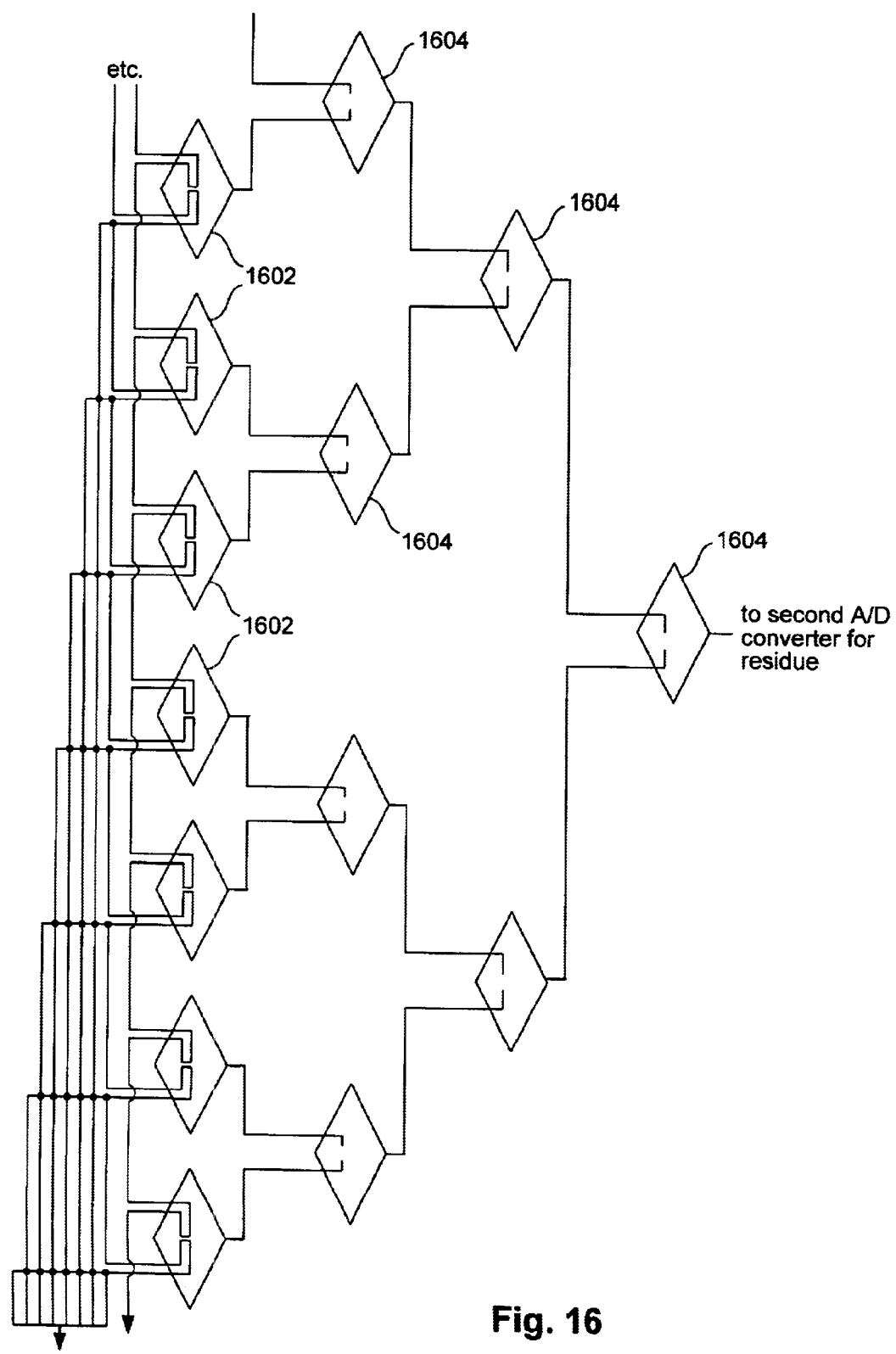
FIG. 16 shows a portion of a half-flash ADC designed according to a specific embodiment of the invention.

According to another embodiment of the invention, the above-referenced elements of a 12-bit parallel ADC may also be employed to construct a 12-bit half-flash ADC. In such a half-flash ADC and as shown in FIG. 16, the first stage is similar to the circuit of FIG. 14, feeding the residue analog signal to a second stage. The output of a first stage comparator 1602 is −S (where S is the saturation output) where the reference current is much greater than the input current,+S where the input current is much greater than the reference current, and a range of intermediate values where the reference and input currents are close in value. The intermediate values vary smoothly and linearly over the range between adjacent reference current values.

The outputs of two adjacent first stage comparators 1602 are fed into a transpinnor XOR gate 1604, a specific implementation of which is described above. If the input signal is significantly different from one of the comparator reference signals, the XOR output is a "0" and the second stage of comparators calculate the six least significant bits. If, on the other hand, the input signal is close in value to one of the reference signals, the output of the XOR is "1" and the six least significant bits are "0."

Six levels of transpinnors are required to calculate the residue of a 6-bit flash ADC. This corresponds to a roughly 5 ns delay with another 2 ns for calculation of the six most significant bits. A provisional analysis indicates that such a two-stage half flash ADC will have a much lower power dissipation than the parallel ADC (e.g., 0.1 W vs. 2.7 W) and many fewer comparators (e.g., 128 vs. 4095), but that its sample rate will be lower (e.g., 150 Msps vs. 500 Msps).

While the invention has been particularly shown and described with reference to specific embodiments thereof, it will be understood by those skilled in the art that changes in the form and details of the disclosed embodiments may be made without departing from the spirit or scope of the invention. For example, embodiments have been described above with reference to various analog-to-digital converter configurations. However, it will be understood that any circuit or electronic system which includes a sample-and-hold circuit designed according to the invention is within the scope of the invention.

In addition, the embodiments of the invention relating to analog-to-digital converters are not limited to the configurations or types mentioned in this specification. That is, any transpinnor-based analog-to-digital converter, and any circuits or electronic systems incorporating such an analog-to-digital converter is within the scope of the invention.

Finally, although various advantages, aspects, and objects of the present invention have been discussed herein with reference to various embodiments, it will be understood that the scope of the invention should not be limited by reference to such advantages, aspects, and objects. Rather, the scope of the invention should be determined with reference to the appended claims.

What is claimed is:

1. A sample-and-hold circuit comprising a network of thin-film elements in a bridge configuration, each of the thin-film elements exhibiting giant magnetoresistance and having a first magnetic film associated therewith which is operable to magnetically bias the associated thin-film element, the circuit also comprising a plurality of conductors inductively coupled to each of the thin-film elements for applying magnetic fields thereto, wherein the circuit is operable using the plurality of conductors to sample and store a value corresponding to an input signal.

2. The sample-and-hold circuit of claim 1 wherein the first magnetic film is operable to magnetically bias the associated thin-film element by applying a substantially constant magnetic field thereto.

3. The sample-and-hold circuit of claim 2 wherein the substantially constant magnetic field is substantially parallel to an easy-axis of the thin-film element.

4. The sample-and-hold circuit of claim 1 wherein the plurality of conductors comprises an input conductor operable to transmit the input signal.

5. The sample-and-hold circuit of claim 4 wherein the plurality of conductors further comprises a sample conductor operable to transmit a sample signal thereby facilitating sampling of the input signal.

6. The sample-and-hold circuit of claim 5 wherein coincidence of the input signal and the sample signal facilitates sampling of the input signal by switching a magnetization vector associated with at least one of the thin-film elements.

7. The sample-and-hold circuit of claim 1 wherein the plurality of conductors comprises a reset conductor operable to demagnetize the thin-film elements before a subsequent sample.

8. The sample-and-hold circuit of claim 7 wherein the reset conductor is operable to demagnetize the thin-film elements by applying a reset magnetic field substantially perpendicular to an easy axis of the thin-film elements.

9. The sample-and-hold circuit of claim 1 wherein the first magnetic film is disposed between the thin-film elements and the conductors.

10. The sample-and-hold circuit of claim 1 wherein the circuit is operable to generate a substantially constant output current representative of the value using a remanent magnetization associated with at least one of the thin-film elements.

11. The sample-and-hold circuit of claim 1 wherein the thin-film elements comprise all-metal structures.

12. The sample-and-hold circuit of claim 1 wherein the thin-film elements comprise four multi-layer structures.

13. The sample-and-hold circuit of claim 12 wherein the multi-layer structures each comprise a plurality of periods of layers.

14. The sample-and-hold circuit of claim 13 wherein each period of layers comprises a first magnetic layer characterized by a first coercivity, a second magnetic layer characterized by a second coercivity, and a nonmagnetic conducting layer interposed between the first and second magnetic layers.

15. The sample-and-hold circuit of claim 1 wherein each thin-film element forms a closed flux structure.

16. The sample-and-hold circuit of claim 1 wherein each thin-film element forms an open flux structure.

17. The sample-and-hold circuit of claim 1 wherein the bridge configuration comprises a Wheatstone bridge.

18. The sample-and-hold circuit of claim 1 wherein the plurality of conductors comprises an input conductor operable to transmit the input signal.

19. The sample-and-hold circuit of claim 18 wherein the plurality of conductors further comprises a sample conductor operable to transmit a sample signal thereby facilitating generation of the output current.

20. The sample-and-hold circuit of claim 19 wherein coincidence of the input signal and the sample signal facilitates generation of the output current by switching a magnetization vector associated with at least one of the thin-film elements.

21. A sample-and-hold circuit comprising a network of thin-film elements in a bridge configuration, each of the thin-film elements exhibiting giant magnetoresistance, the circuit also comprising a plurality of conductors inductively coupled to each of the thin-film elements for applying magnetic fields thereto, wherein the circuit is operable using the plurality of conductors to generate a substantially constant output current representative of an input signal using a remanent magnetization associated with at least one of the thin-film elements.

22. The sample-and-hold circuit of claim 21 wherein the plurality of conductors comprises a reset conductor operable to initialize magnetizations associated with each of the thin-film elements to a repeatable state.

23. The sample-and-hold circuit of claim 22 wherein the reset conductor is operable to initialize the magnetizations by applying a reset magnetic field substantially perpendicular to an easy axis of the thin-film elements.

24. The sample-and-hold circuit of claim 21 wherein the thin-film elements comprise all-metal structures.

25. The sample-and-hold circuit of claim 21 wherein the thin-film elements comprise four multi-layer structures.

26. The sample-and-hold circuit of claim 25 wherein the multi-layer structures each comprise a plurality of periods of layers.

27. The sample-and-hold circuit of claim 26 wherein each period of layers comprises a first magnetic layer characterized by a first coercivity, a second magnetic layer characterized by a second coercivity, and a nonmagnetic conducting layer interposed between the first and second magnetic layers.

28. The sample-and-hold circuit of claim 21 wherein each thin-film element forms a closed flux structure.

29. The sample-and-hold circuit of claim 21 wherein each thin-film element forms an open flux structure.

30. The sample-and-hold circuit of claim 21 wherein the bridge configuration comprises a Wheatstone bridge.

31. A sample-and-hold circuit comprising a network of thin-film elements in a bridge configuration, each of the thin-film elements exhibiting giant magnetoresistance, the circuit also comprising a signal conductor operable to transmit an input signal, and a sample conductor operable to transmit a strobe signal, the signal and sample conductors being inductively coupled to selected ones of the thin-film elements, wherein the circuit is operable to sample and store a value corresponding to the input signal in response to the strobe signal.

32. The sample-and-hold circuit of claim 31 wherein coincidence of the input signal and the strobe signal facilitates sampling and storage of the value by switching a magnetization vector associated with at least one of the thin-film elements.

33. The sample-and-hold circuit of claim 31 further comprising a reset conductor operable to initialize magnetizations associated with each of the thin-film elements to a repeatable state.

34. The sample-and-hold circuit of claim 33 wherein the reset conductor is operable to initialize the magnetizations by applying a reset magnetic field substantially perpendicular to an easy axis of the thin-film elements.

35. The sample-and-hold circuit of claim 31 wherein the circuit is operable to sample and store the value using a remanent magnetization associated with at least one of the thin-film elements.

36. The sample-and-hold circuit of claim 31 wherein the thin-film elements comprise all-metal structures.

37. The sample-and-hold circuit of claim 31 wherein the thin-film elements comprise four multi-layer structures.

38. The sample-and-hold circuit of claim 37 wherein the multi-layer structures each comprise a plurality of periods of layers.

39. The sample-and-hold circuit of claim 38 wherein each period of layers comprises a first magnetic layer characterized by a first coercivity, a second magnetic layer characterized by a second coercivity, and a nonmagnetic conducting layer interposed between the first and second magnetic layers.

40. The sample-and-hold circuit of claim 31 wherein each thin-film element forms a closed flux structure.

41. The sample-and-hold circuit of claim 31 wherein each thin-film element forms an open flux structure.

42. The sample-and-hold circuit of claim 31 wherein the bridge configuration comprises a Wheatstone bridge.

* * * * *